United States Patent [19]

Vohra et al.

[11] Patent Number: 5,396,166
[45] Date of Patent: Mar. 7, 1995

[54] FIBER OPTIC INTERFEROMETRIC ELECTRIC FIELD AND VOLTAGE SENSOR UTILIZING AN ELECTROSTRICTIVE TRANSDUCER

[75] Inventors: Sandeep T. Vohra; Frank Bucholtz, both of Crofton, Md.; Alan D. Kersey, Springfield, Va.

[73] Assignee: The United States of America as represented by the Secretary of the Navy, Washington, D.C.

[21] Appl. No.: 936,986

[22] Filed: Aug. 27, 1992

[51] Int. Cl.$^6$ .............................................. H01J 40/14
[52] U.S. Cl. ................... 324/96; 250/227.14
[58] Field of Search ................ 324/96, 158 R, 117 R, 324/244.1; 310/311; 250/227.14, 227.17; 264/63, 65; 204/299 R; 501/136

[56] References Cited

U.S. PATENT DOCUMENTS

| | | | |
|---|---|---|---|
| 4,433,291 | 2/1984 | Yariv et al. | 324/244 |
| 4,477,723 | 10/1984 | Carome et al. | 324/96 |
| 4,524,322 | 6/1985 | Bobb | 324/96 |
| 4,603,296 | 7/1986 | Koo et al. | 324/244 |
| 4,881,813 | 11/1989 | Koo et al. | 324/244 |
| 4,899,042 | 2/1990 | Falk et al. | 324/96 |
| 4,929,830 | 5/1990 | Bohnert et al. | 324/96 |
| 4,939,447 | 7/1990 | Bohnert et al. | 324/96 |
| 5,023,032 | 6/1991 | Bailey et al. | 264/63 |
| 5,090,824 | 2/1992 | Nelson et al. | 250/227.14 |
| 5,135,897 | 8/1992 | Uchino et al. | 501/136 |
| 5,171,981 | 12/1992 | Wood | 329/96 |
| 5,173,162 | 12/1992 | Hagimura et al. | 204/299 R |
| 5,229,979 | 7/1993 | Scheinbeim et al. | 310/311 |
| 5,245,734 | 9/1993 | Issartel | 29/25.35 |

OTHER PUBLICATIONS

E. Udd; "Fiber Optic Sensors–An Introduction for Engineers and Scientists"; John Wiley & Sons, Inc., New York, pp. 271–323; 1991.
Cross et al; "Piezoelectric and Electrostrictive Materials for Transducer Application"; pp. 1–16; Feb. 1, 1990–Jan. 31, 1991.

Primary Examiner—Vinh Nguyen
Attorney, Agent, or Firm—Thomas E. McDonnell; George Jameson

[57] ABSTRACT

A fiber optic interferometer sensor system utilizing a fiber optic interferometer with an elecrostrictive transducer bonded to one of first and second optical fiber arms of the interferometer for obtaining excellent low frequency voltage detectors and electric field sensors. The non-linear characteristics of the electrostrictive transducer allows for detecting low frequency or dc signals at sidebands of a high frequency carrier, resolving extremely small voltages at low frequencies, or sensing low frequency electric fields. Examples of electrostrictive material include Ba:PZT, PLZT, PMN+PT, and other doped ferroelectric relaxors.

17 Claims, 5 Drawing Sheets

FIBER OPTIC INTERFEROMETRIC ELECTRIC FIELD AND VOLTAGE SENSOR UTILIZING AN ELECTROSTRICTIVE TRANSDUCER

BACKGROUND OF THE INVENTION

1. Field of the Invention

The present invention is directed to a sensor including an electrostrictive transducer and, more particularly, to a fiber optic interferometer utilizing an electrostrictive transducer for sensing low frequency electric fields, resolving extremely small voltages at frequencies between dc and 100 Hz (Hertz) when used in conjunction with a high frequency carrier, and for detecting high frequency signals in the range from 100 Hz to 100 kHz with an applied dc bias.

2. Description of the Related Art

Prior art interferometers used as electric field or voltage sensors usually employ piezoelectric materials in a transducing element. The strain e in piezoelectric materials (the strain being the length change of the material divided by the total length of the material) is linearly related to the applied electric field E (e=kE, where k is a constant and E=V/d where V is the voltage and d is the material thickness). When an optical fiber is attached to such a material, the induced strain in the material is transferred to the optical fiber, producing an optical phase shift shift proportional to the strain in the fiber. In measuring low frequency electric fields, however, the low frequency signals cannot be separated from noise or are separated with much difficulty and low accuracy. In addition, the noise spectrum generally exhibits 1/f dependencies which impedes dc and low frequency resolution. Reported values for a minimum detected field for a fiber optic electric field sensor, using a piezoelectric sensing element and employing 60 cm of optic fiber bonded to the piezoelectric material, are in the range of 50-90 V/m/$\sqrt{Hz}$ at 10 Hz. Piezoelectric sensing elements are not particularly accurate below 10 Hz because of the noise that interferes with low level signals of interest.

Non-linear transducers such as magnetostrictive alloys (e.g., Metglas 2605S-2) have been employed in fiber optic interferometers to overcome the 1/f noise problem by mixing a signal at a frequency $\Omega$ with a carrier or "dither" at a much higher frequency $\omega$. This "up converts" or heterodynes the low frequency signal away from the noise to a region ($\omega+\Omega$) where 1/f noise is insignificant. Resolutions for magnetostrictive alloys have a minimum detected field of 10 pT/$\sqrt{Hz}$ at 1 Hz. The magnetostrictive alloys, however, are used to detect magnetic fields and not low frequency electric fields or voltages.

SUMMARY OF THE INVENTION

One object of the present invention is to provide a non-linear transducer employing an electrostrictive material in a fiber optic interferometer to obtain significantly better low frequency voltage detectors and better resolution low frequency electrical field sensors in a fiber optic interferometer.

Another object of the present invention is to provide an electrostrictive transducer which is able to upconvert low frequency signals as sidebands of a high frequency carrier.

A further object of the present invention is to provide an electrostrictive transducer which can be used where high resolution electric fields need to be sensed and high resolution voltages measured.

The present invention achieves the above-mentioned objects by providing a fiber optic interferometer with a transducer which employs electrostrictive materials which have strain quadratically related to an applied electric field. The device can be used, for example, as an electric field sensor or a voltage sensor.

The electrostrictive transducer is a non-linear transducer which can upconvert low frequency signals as sidebands of a high frequency carrier.

Fiber optic interferometers using electrostrictive transducers can be employed, for example, as high resolution volt meters, high resolution ac gradiometers, high resolution, dc and low frequency electric field sensors, or high frequency electric field sensors. The electrostrictive transducer can be formed from a sheet of electrostrictive material, for example, Ba:PZT, which is a barium doped lead zirconate titanate having an optical fiber wound securely around the material. The electrostrictive transducer material can also be formed, for example, as a block, cylinder, rectangle, or square of electrostrictive material. A length of an optic fiber is bonded to the electrostrictive material and one or more electrostrictive transducers be positioned in one arm or each arm of a fiber optic interferometer.

The above-mentioned objects, together with other objects, features and advantages of the invention which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Fiber optic interferometers are used in many applications for measuring different types of signals. Basically, a fiber optic interferometer includes a laser coupled to at least two fiber optic cables through a first coupler. A light beam from the laser is split between the fiber optic cables and rejoined at a second coupler. One of the two or both of the cables includes a sensor or transducer sensing a value of interest. Detectors detect the output from each cable and send the outputs to a differential amplifier. A difference signal can be sent to a spectrum analyzer. This type of interferometer is called a Mach-Zehnder interferometer.

Fiber optic interferometers employing piezoelectric transducers cannot measure low frequency signals on the order of dc to 100 Hz with high resolution because of the presence of noise attributable to environment, the system, etc., and the low frequency signals are at approximately the same level and in the same low frequency range as the noise. The present invention has solved this problem by providing a fiber optic interferometer with an electrostrictive transducer which is non-linear in nature.

Figure 1:
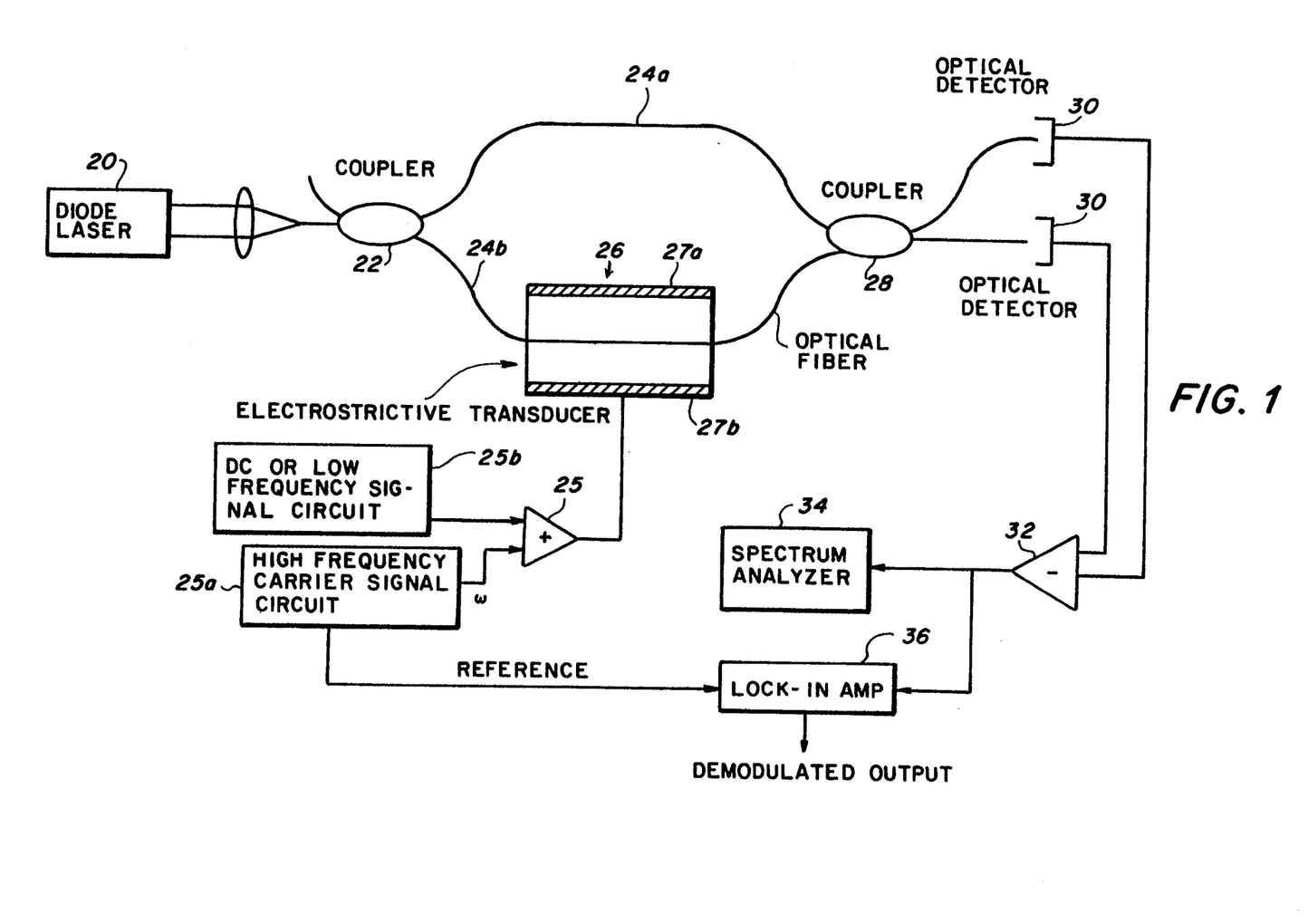
FIG. 1 is a general schematic diagram of a fiber optic interferometer employing an electrostrictive transducer according to a first embodiment of the present invention.

A fiber optic interferometer employing an electrostrictive transducer according to a first embodiment of the present invention is shown in FIG. 1. FIG. 1 essentially shows a Mach-Zehnder type fiber optic interferometer for measuring fiber optic dc and low frequency electric fields. As discussed above, the device in FIG. 1 includes a conventional laser 20 and a conventional first coupler 22 for receiving laser light from the laser 20 and dividing the laser light into at least two equal inputs. The laser light is then input into at least two conventional single mode optical fibers (arms) 24a and 24b. One optical fiber (arm) 24b has an electrostrictive transducer 26 bonded thereto using, in the same manner as with piezoelectric transducers, epoxy, coupling fluid or any material that will maintain contact between the optical fiber and the electrostrictive material. The optical fiber 24b is bonded to the electrostrictive transducer 26 in a direction in which the largest resonance occurs to obtain the largest M coefficient. For example, if the electrostrictive transducer 26 is a tube, the optical fiber is wound circumferentially; if it is a strip of ceramic, it is placed longitudinally on the electrostrictive material. It can also be placed transverse, depending on the shape of the electrostrictive material. The electrostrictive material expands and contracts in all directions when an oscillating electric field from, for example, an oscillator (not shown, the oscillator being inside the high-frequency carrier signal circuit 25a) is applied. The oscillating electric field is applied to the electrostrictive transducer 26 by way of, for example, field plates or contacts 27A and 27B attached to the electrostrictive transducer 26 in the same manner as with piezoelectric transducers.

An adding circuit 25 adds a dc or low frequency signal (that is to be measured by the interferometer) from a dc or low frequency signal circuit 25b and a high frequency carrier signal ($\omega$) from the high frequency carrier signal circuit 25a and applies the combined signals to the electrostrictive transducer 26. The low frequency signal is in a range from dc to 100 Hz and the high frequency carrier signal is above 1 kHz. The dc or low frequency signal circuit 25b can be, for example, an antenna or any other device which produces a low frequency voltage signal to be measured. The high frequency signal from the circuit 25a is an ac carrier with a frequency typically between 1 kHz and 100 kHz.

The electrostrictive material in the electrostrictive transducer 26 expands and contracts responsive to the high and low frequency signals. The optical fiber 24b bonded to the electrostrictive material lengthens and shortens as a result of the high and low frequency signals. The light beams from the two arms 24a and 24b of the optical fiber are then combined by a second conventional coupler 28. As the electrostrictive transducer 26 expands and contracts as a function of applied voltage or electric field (E), the optic fiber of the optical fiber arm 24b, to which the electrostrictive transducer 26 is attached, changes in length due to the strain (e) applied to it by the transducer 26. The change in length of the fiber arm 24b produces a difference in phase at the output ports of the coupler 28 between the light beams from the arms 24a and 24b. Portions of the light beams from the arms 24a and 24b are combined into an optical interference pattern at each of the output ports of the coupler 28. The optical interference patterns at the output ports of the coupler 28 are respectively converted into electrical signals by conventional optical detectors 30. The outputs from the optical detectors 30 are then applied to a differential amplifier 32 which amplifies the difference signal and applies the amplified difference signal to a spectrum analyzer 34 for display. The output from the differential amplifier 32 is also applied to a conventional lock-in-amplifier 36 along with a reference signal from the high frequency carrier signal circuit 25a to obtain a demodulated output. It should be noted at this time that the embodiment of FIG. 1 (as well as the to-be-discussed embodiment of FIG. 5) can also operate with only one optical detector 30. In this case, one of the optical detectors 30 and the differential amplifier 32 can be removed, and the output from the remaining optical detector 30 can be applied in parallel to the lock-in amplifier 36 and the spectrum analyzer 34. The above-mentioned components, except for the electrostrictive transducer 26, are all conventional off-the-shelf devices and components.

Upon the application of an electric field (or voltage), the electrostrictive material (to be discussed) of the electrostrictive transducer 26 undergoes strain (e). The induced strain in the electrostrictive material is quadratically related to the applied electric field (E). That is, the induced strain e depends non-linearly on the applied electric field E:

$$e = ME^2$$

where M is the electrostrictive coefficient of the material. This non-linearity allows for the upconversion of low frequency signals as sidebands of a selected high frequency carrier which greatly improves low frequency resolution and results in significantly improved low frequency electric field sensors and voltage detectors compared to the prior art.

Electrostrictive materials include Ba:PZT (($Pb_{0.73}Ba_{0.27})_{0.97} Bi_{0.02} (Zr_{0.3} Ti_{0.3}) O_3$) which is barium-doped lead zirconate titanate, PMN+PT which is lead magnesium niobate plus lead titanate, or PLZT, which is lead lanthinum zirconate titanate, for example. The basic component of an electrostrictive material is a ferroelectric relaxor such as PZT or PMN which can be doped with Ba or any material which will make the material exhibit electrostrictive qualities. Lead-based perovskite structures are characterized by extremely large dielectric permitivities $\kappa$. Since the strain e in relaxor ferroelectrics is related to the applied field E by $e = Q(\kappa \epsilon_0)^2 E^2$ (where Q=an electrostrictive constant, $\kappa$=dielectric constant and $\epsilon_0 = 8.85 \times 10^{-12}$ F/m), a large effective electrostrictive coefficient M is possible. The larger the electrostrictive coefficient M of the material, the larger the strain, which is desirable.

The present invention was built and tested using an electrostrictive material of Ba:PZT bonded to a 1 cm section of fiber (3 fiber passes laid across the material in the same manner as in a piezoelectric transducer) in one arm of a Mach-Zehnder type fiber optic interferometer. The dimensions of the electrostrictive material depend on the field being measured. An exemplary 300 Å gold film on each face of the electrostrictive material is provided for electrical contact. However, it should be understood that the thickness of the film can be other than 300 Å and that the film can be made from any suitable conductive material. The phase shift of light propagating in the optic fiber 24b attached to the electrostrictive material of the transducer 26 is a direct measure of the electric field generated strain.

The electric field which excites the electrostrictive transducer 26 is given by $$E = E_{dc} + E_\omega \cos \omega t + E_\Omega \cos \Omega t \qquad \text{Eq. (1)}$$

where $E_\omega$ is the amplitude of the carrier, $E_\Omega$ is the amplitude of the low frequency field, and $E_{dc}$ is the dc bias. The electrostrictive ceramic produces strains $$e_\omega = (2 M E_{dc} E_\omega) \cos \omega t \qquad \text{Eq. (2a)}$$

$$e_{\omega \pm \Omega} = M E_\omega E_\Omega \cos (\omega \pm \Omega) t \qquad \text{Eq. (2b)}$$

in addition to strains $e_{dc}$, $e_\Omega$ and higher harmonics. The term $e_{\omega \pm \Omega}$ is the sum/difference frequency.

The amplitude of the optical phase shift due to $e_{\omega \pm \Omega}$ is given by $$\phi_{\omega \pm \Omega} = KMLE_\omega E_\Omega \qquad \text{Eq. (3)}$$

where L is the length of the fiber interacting with the electrostrictive element, M is the electrostrictive parameter, and $K = (2\pi n/\lambda)\xi$, $\lambda$ being the free space wavelength, n being the core refractive index, and $\xi$ being the strain-optic factor. The dc electric fields are measured by monitoring the phase shift at the fundamental $\omega$ $$\phi_\omega = 2KMLE_\omega E_{dc} \qquad \text{Eq. (4)}$$

Phase sensitive detection is used to measure the voltage at the fundamental $\omega$ and the sidebands $\omega \pm \Omega$.

In a fiber optic interferometer using linear transducers, the strain must be detected in the material at the actual frequency that is being detected. At low frequencies, for example, 1 Hz, there is a great amount of low frequency noise due to environment, acoustic noise, any mechanical low frequency agitation, or otherwise. The amplitude of the noise can be so high that weak signals cannot be detected. Therefore, the resolution of the device for measuring strain is limited. That is, low frequency resolution is limited. To overcome this, a non-linear electrostrictive transducer is used in which a test signal (the low frequency or dc signal being measured) and a high frequency voltage signal from the high frequency carrier signal circuit 25a are both applied to the electrostrictive transducer 26 by way of, for example, gold contacts 27A and 27B placed on the electrostrictive transducer 26 where the electric field is to be measured to obtain a sum/difference frequency. This allows a strain signal at $\omega$, a strain signal at $2\Omega$ and a strain signal at the sum/difference frequency ($\omega \pm \Omega$).

Figure 2:
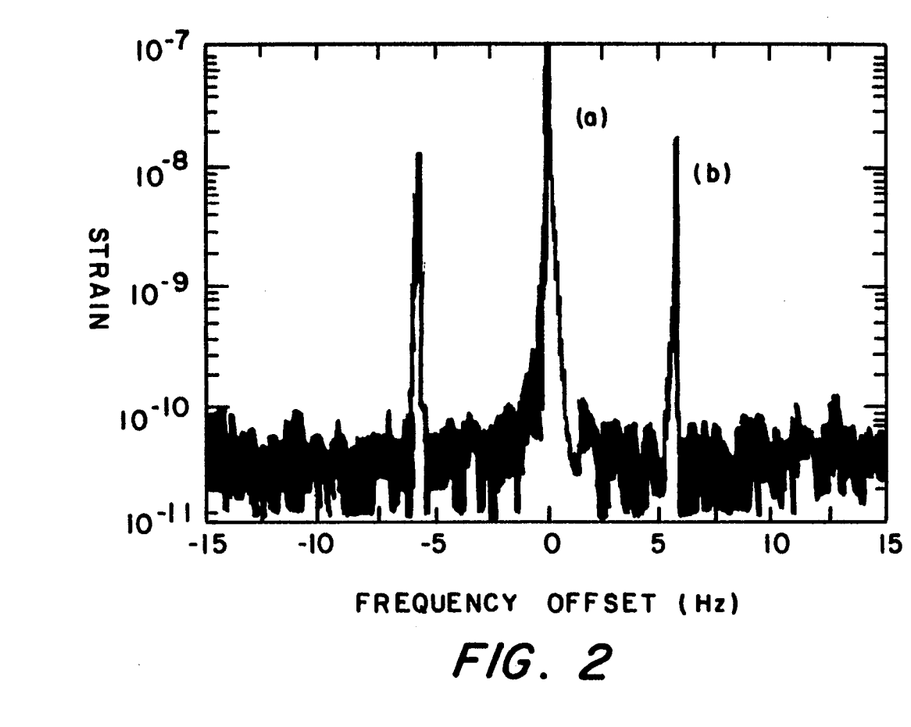
FIG. 2 is a graph of a power spectrum of the output of the interferometer shown in FIG. 1 when used as a low frequency electric field sensor or voltage sensor.

FIG. 2 shows a power spectrum of the output near $\omega/2\pi = 2.85$ kHz. FIG. 2 shows the spectrum for $E_\omega = 40$ kV/m and $E_\Omega = 100$ V/m, corresponding to applied voltages $V_\omega = 40$ V and $V_\Omega = 0.1$ V with the carrier centered about 0 Hz for convenience of illustration. The signal to noise ratio of the sideband signal produced was 55 dB, corresponding to a minimum detectable field of 0.35 V/m/$\sqrt{\text{Hz}}$ (BW=250 mHz), limited by the dynamic range of the spectrum analyzer. Large strains at 2e limits the signal-to-noise ratio of the sidebands imposed by an 80 db dynamic range of the spectrum analyzer. A 5 Hz test signal being measured is applied to the device and appears as expected from Eq. (2b) as the sidebands $\omega$. The zero frequency offset corresponds to $\omega/2\pi = 2.85$ kHz (a in FIG. 2) and the signal $E_\Omega \cos \Omega t$ corresponds to $\Omega/2\pi = 5$ Hz appearing at the sidebands of $\omega$ (b in FIG. 2). The low frequency signal has been "upconverted" away from the noise by the electrostrictive transducer 26 and can easily be detected. The quadratic effect of the electrostrictive material allows this "upconversion" which is not possible with linear devices using, for example, piezoelectric material.

As shown in FIG. 2, the minimum detectable field at 5 Hz for a fiber optic electric field sensor utilizing a non-linear electrostrictive transducer (Ba:PZT) is several orders of magnitude better than for a device using a linear transducer (90 V/m/$\sqrt{\text{Hz}}$ at 10 Hz). The resolution of the low frequency signal can be easily extrapolated for frequencies below 5 Hz. It is clear from Eq. (2b) and Eq. (3) that for a fixed $E_\Omega$ the strength of the sideband signal is linearly dependent on $E_\omega$.

Figure 3:
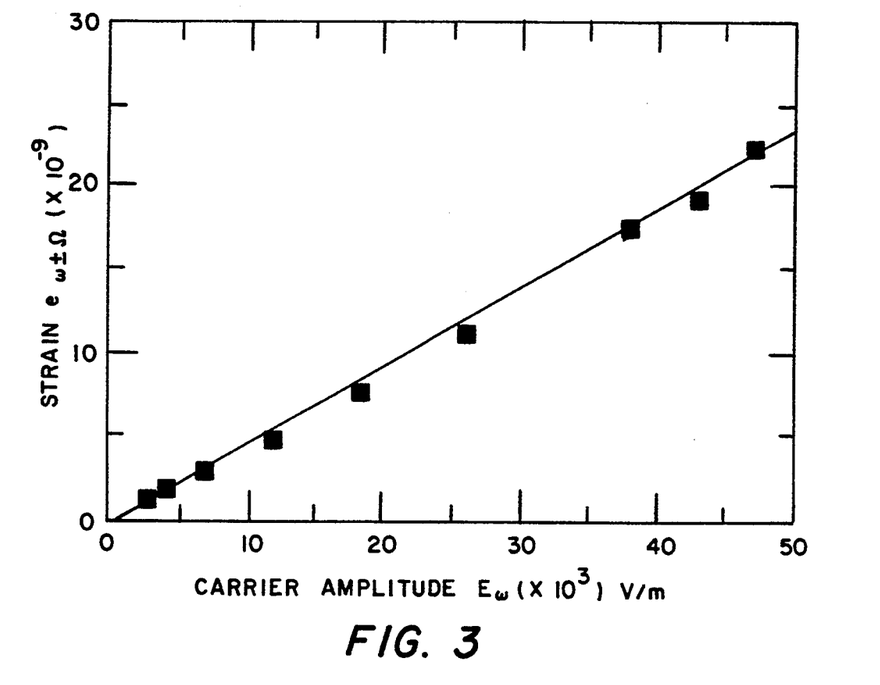
FIG. 3 is a graph of the strength of the sidebands of the output of the interferometer shown in FIG. 1, dependent on the amplitude of the high frequency carrier signal applied to the electrostrictive material.

FIG. 3 is a graph of the strength of the sidebands of the 2.85 kHz carrier signal. FIG. 3 shows the dependence of the sideband signal on $E_\omega$ for $E_\Omega = 1000$ V/M, which follows the predictions from Eq. (3). A simple calculation from Eq. (2b) and Eq. (3) predicts that for 30 m of fiber attached to an electrostrictive material a minimum detectable field of $\leq 10(\mu\text{V/m})/\sqrt{\text{Hz}}$, corresponding to a low frequency resolution of $\leq 10^{-9}$ V/$\sqrt{\text{Hz}}$ at 100 milli Hertz, (limited by interferometer phase noise) is possible. The calculation assumes a carrier of 100 volts on a 100 μm thick electrostrictive plate and an electrostrictive coefficient $M = 10^{-15} \text{m}^2/\text{V}^2$. As shown, the strength of the sidebands depends on the strength of the signal being measured and also the strength (amplitude) of the high frequency carrier. Finally, the dc field sensing capacity of the electrostrictive transducer 26 was measured. From Eq. (2a) and Eq. (4), it is clear that for a fixed electric dither field, the strain at $\omega$ is linearly dependent on the dc field. Practically speaking, there are limitations on how high and/or how strong a high frequency signal can be applied.

Figure 4:
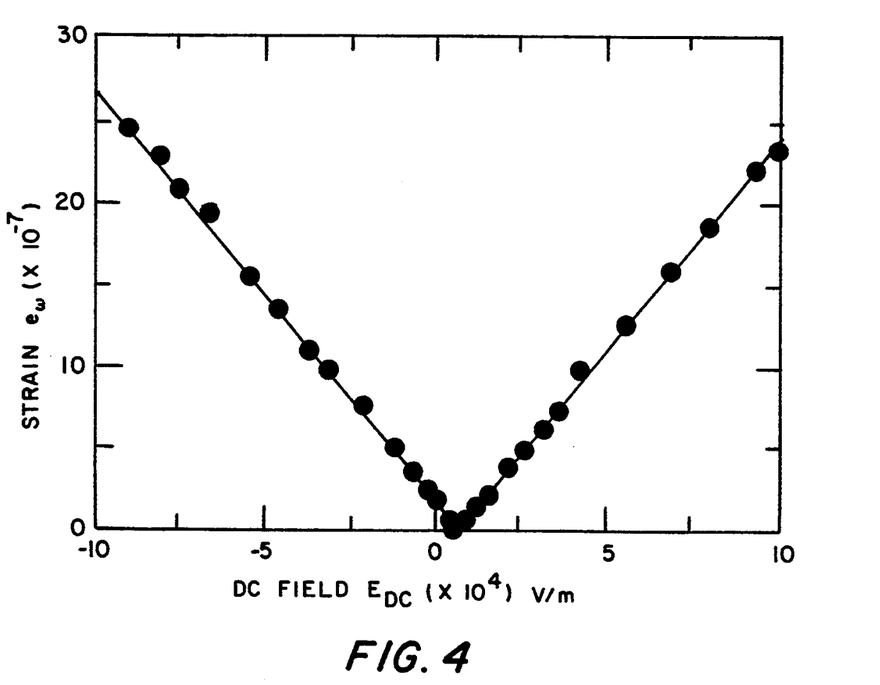
FIG. 4 is a graph showing the linear dependence of the strain on a dc field at high frequency when the interferometer is used as a dc field sensor.

FIG. 4 is a graph of the response of the fiber optic interferometric electric and voltage sensor of FIG. 1 operated as a dc field sensor. FIG. 4 shows the dependence of the strain $e_\omega$ on the dc field for a fixed carrier amplitude $E = 40$ kV/m at $\omega/2\pi = 2.85$ kHz. If $\Omega = 0$, the sidebands collapse on the high frequency carrier. The strain e depends linearly on the dc field at high frequencies.

Figure 5:
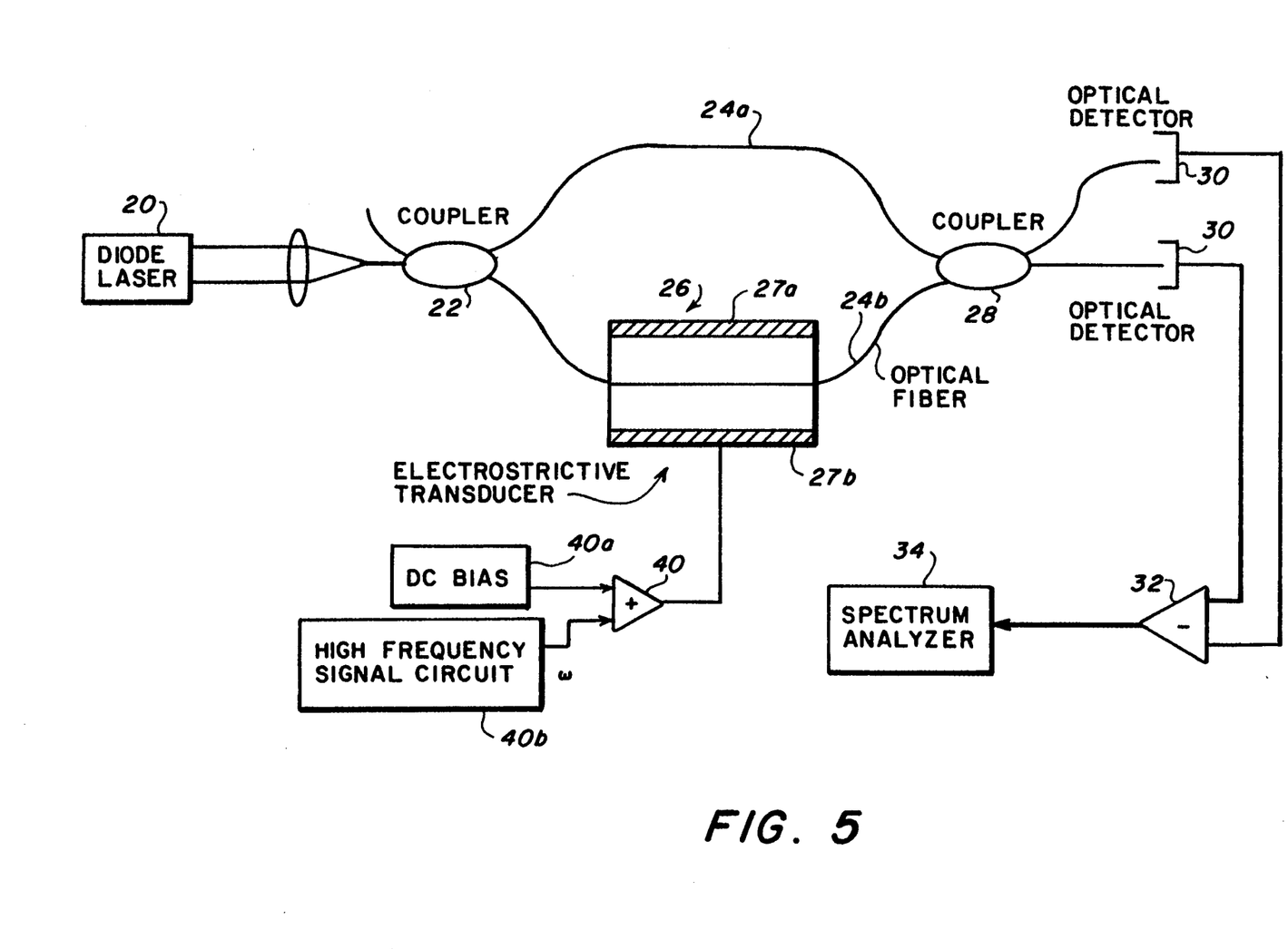
FIG. 5 is a general schematic diagram of a fiber optic interferometer for sensing an ac electric field employing the electrostrictive transducer according to a second embodiment of the present invention.
Figure 6A:
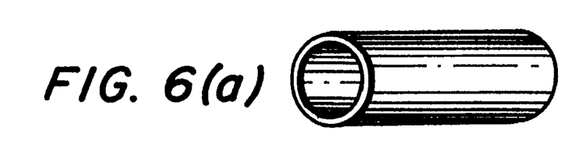
FIGS. 6(a)-6(e) show various configurations of the electrostrictive transducer material according to the present invention.
Figure 6B:
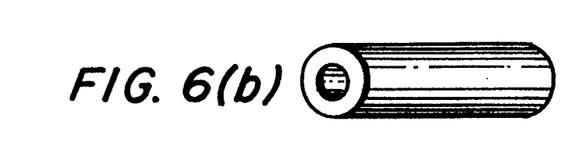
Figures 6C, 6D:
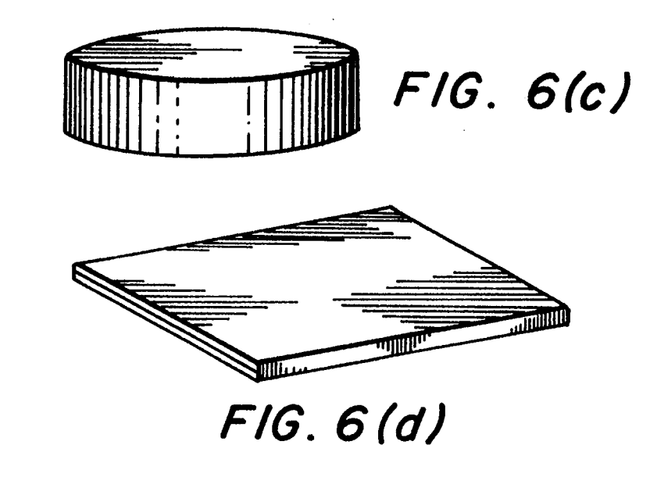
Figure 6E:
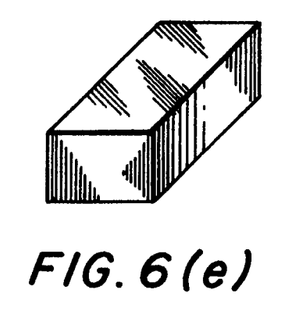

FIG. 5 is a diagram of a fiber optic interferometer employing an electrostrictive transducer for sensing an ac electric field according to a second embodiment of the present invention. The device in FIG. 5 is similar to that shown in FIG. 1 and like reference numerals refer to like parts.

The electrostrictive transducer 26 for measuring an ac electric field is excited by a total electric field E where $E = E_{dc} + E_\omega \cos \omega t$, where $E_\omega$ is the amplitude of the ac field to be measured, and $E_{dc}$ is the dc bias field. This produces a strain component of $$e_\omega = (2 M E_{dc} E_\omega) \cos \omega t \qquad \text{Eq. (5)}$$

which is the same as Eq. 2(a), along with strain components $e_{dc}$ and $e^{2\omega}$. From Eq. (5) it is clear that when a large dc bias is applied to the electrostrictive transducer 26, a small ac perturbation will produce a large strain component $e_\omega$. This will also produce a phase shift of $$\phi_\omega = 2KMLE_{dc}E_\omega \qquad \text{Eq. (6)}$$

as noted above with respect to equation (6). It is clear from Eq (6) that a dc bias is required for the sensor to function as an ac electric field or voltage sensor.

In FIG. 5, a dc bias from a dc bias circuit 40a is applied to the electrostrictive transducer 26 by way of an adder 40. The larger the dc bias, the more enhanced the high frequency resolution. A high frequency signal ω to be measured, from a high frequency signal circuit 40b, is combined in the adder 40 with the dc bias from circuit 40a. The combined signals are then applied to the electrostrictive transducer 26. The high frequency signal circuit 40b can include, for example, an antenna. The ac fiber optic electric field sensor obtains high resolution because of the non-linear characteristics of the electrostrictive transducer 26 along with the applied dc bias.

The fiber optic interferometer shown in FIG. 5 was tested using a 1 cm×5 cm×0.6 cm electrostrictive transducer 26 including four 15 μm thick layers each being 1 cm×5 cm of lead magnesium layered niobate/lead titanate (PMN) which is also a ferroelectric relaxor. This layered electrostrictive material is commercially available. As noted above, any electrostrictive material can be used depending on the characteristics desired. The optical fiber is bonded longitudinally to the electrostrictive transducer employing a 5 cm section of fiber (three passes) in one arm of a Mach-Zehnder type interferometer as in a piezoelectric transducer. In this example, longitudinal bonding provides optimal results. Electrical contacts 27A and 27B for providing the dc bias and the high frequency signal were made with wires bonded to faces of the electrostrictive transducer 26 in the direction the electric field, etc., is to be measured.

The ac resolution of the device shown in FIG. 5 was measured by applying a dc bias ($V_{dc}$=100 V) and observing the signal-to-noise ratio of a small ac signal ($E_\omega$=60 mV/m) in a 1 Hz bandwidth. Electric field resolution of 7(μV/m)/√Hz with an equivalent voltage resolution ($V_{res}$) of 1 nV/√Hz for 0.15 m of fiber is obtained. The resolution of similar ac electric field sensors for 15 m of fiber and a dc bias of $V_{dc}$=25 V is predicted to be 25(nV/m)/√Hz, ($V_{res}$)≈5 pV/√Hz. As mentioned above, the ac carrier frequency is typically less than 100 kHz, but not limited thereto.

The present invention can be used anywhere where high resolution electric fields need to be sensed and high resolution voltages measured. The present invention can be employed in biomedical, atmospheric, oceanographic, geological, space and electrical applications, to name a few. It can also be employed as an electric field gradiometer for picking up minute electric field changes. That is, an electrostrictive transducer can be bonded to each fiber optic arm of the interferometer. The transducer can then be moved or the electric field changed. The phase shift is then detected and the electric field in that area is determined. More than one electrostrictive transducer can be placed in each arm of the interferometer to obtain a multi-axis electric field sensor or voltage sensor.

The electrostrictive transducer 26 does not necessarily have to be rectangular in form. As shown in FIGS. 6(a)–6(e), the electrostrictive transducer can be cylindrical, elliptical, rectangular or square in shape, and a sheet or block. It can also be a thin-walled or a thick-walled hollow cylinder. However, if the material is too thick, the resolution is affected, because a very high ac voltage will need to be applied. Any shape that allows the optical fiber to contact the most surface area can be employed. The optical fiber can be wound or placed in the electrostrictive transducer in any direction that resonance occurs and will obtain the largest M coefficient. As mentioned previously, the optical fiber is adhered to the electrostrictive structure with epoxy, coupling fluid or anything that keeps the optical fiber in physical contact with the electrostrictive material. More than one optical fiber can be bonded to the electrostrictive material to sense fields in various directions.

The electrostrictive transducer of the present invention can be used in any type of interferometer, and is not necessarily restricted to a Mach-Zehnder type as shown in FIG. 1. For example, it can be used in a Michelson interferometer, Fabry-Perot interferometer, etc. Arrays of electrostrictive interferometers are also possible employing the electrostrictive transducer of the present invention.

The foregoing is considered as illustrative only of the principles of the present invention. Further, since numerous modifications and changes will readily occur to those skilled in the art, it is not desired to limit the invention to the exact construction and applications shown and described. Accordingly, all suitable modifications and equivalents may be resorted to, falling within the scope of the invention and the appended claims and their equivalents.

What is claimed is:

1. A fiber optic interferometer sensor system for sensing a first signal to be measured in the form of an electric field or a voltage comprising:

a laser for emitting a light signal;

first and second optical fiber arms;

a first coupler coupled between said laser and proximal ends of said first and second optical fiber arms for dividing the light signal from said laser into two portions along said first and second optical fiber arms;

a nonlinear electrostrictive transducer bonded to one of said first and second optical fiber arms for sensing the first signal to be measured;

means for producing a second signal;

means responsive to the first signal to be measured and to the second signal for producing and applying a composite signal said nonlinear electrostrictive transducer to induce a nonlinear strain in said nonlinear electrostrictive transducer in order to enhance the sensing of said at least one of an electric field and a voltage to be measured by said nonlinear electrostrictive transducer;

a second coupler coupled to distal ends of said first and second optical fiber arms for combining the light signals from said distal ends of said first and second optical fiber arms to develop an optical interference pattern representative of the phase difference between said light signals from said first and second optical fiber arms;

at least one detector for detecting the phase difference between the light signals from said first and second optical fiber arms and producing at least one electrical signal proportional to the intensity of said optical interference pattern; and means responsive to said at least one electrical signal from said at least one detector for developing an output signal.

2. The fiber optic interferometer sensor system of claim 1 wherein:

said electrostrictive transducer mixes a low frequency signal between dc and 100 Hz to be measured as said first signal, with a high frequency carrier above 1 kHz as said second signal, for detecting low frequency electric field signals as the sidebands of the high frequency carrier.

3. The fiber optic interferometer sensor system of claim 1 wherein:

said electrostrictive transducer comprises a high resolution, low frequency voltage sensor, the low frequency being between dc and 100 Hz.

4. The fiber optic interferometer sensor system of claim 1 wherein:

said electrostrictive transducer comprises an electric field sensor.

5. The fiber optic interferometer sensor system of claim 1 wherein:

said electrostrictive transducer comprises a high resolution voltage sensor.

6. The fiber optic interferometer sensor system of claim 1 wherein:

said electrostrictive transducer includes an electrostrictive material.

7. The fiber optic interferometer sensor system of claim 6 wherein:

said electrostrictive material has non-linear properties.

8. The fiber optic interferometer sensor system of claim 7 wherein:

said electrostrictive material comprises a ferroelectric relaxor.

9. The fiber optic interferometer sensor system of claim 8 wherein:

said electrostrictive material is selected from the group consisting of Ba:PZT and PLZT.

10. The fiber optic interferometer sensor system of claim 8 wherein:

said electrostrictive material comprises PMN+PT material.

11. The fiber optic interferometer sensor system of claim 8 wherein:

said electrostrictive transducer is bonded to one of said first and second optical fiber arms by a material selected from the group consisting of epoxy and a coupling fluid.

12. The fiber optic interferometer sensor system of claim 8 wherein said means for producing a second signal comprises:

dc bias means for applying a dc bias as said second signal to said means for producing and applying a composite signal.

13. The fiber optic interferometer sensor system of claim 12 wherein:

said means for producing and applying a composite signal comprises an adder, operatively connected to said electrostrictive transducer, for combining an electric field as said first signal and the dc bias as said second signal into said composite signal and applying said composite signal to said electrostrictive transducer.

14. The fiber optic interferometer sensor system of claim 13 wherein:

said electrostrictive transducer comprises an ac field sensor.

15. The fiber optic interferometer sensor system of claim 14 wherein:

said adder also applies an ac carrier to said electrostrictive transducer.

16. The fiber optic interferometer sensor system of claim 8 further including:

a plurality of contacts bonded to said electrostrictive transducer for applying said at least one of the electric field and voltage to be measured as said first signal, and for also applying an associated one of a dc bias and an ac carrier signal as said second signal.

17. The fiber optic interferometer sensor system of claim 16 wherein:

at least one of said optical fiber arms being bonded to said electrostrictive transducer in a direction maximizing a length change of said electrostrictive transducer caused by said applied at least one of the electric field and voltage to be measured.

* * * * *